United States Patent [19]

Beard

[11] Patent Number: 5,641,294

[45] Date of Patent: Jun. 24, 1997

[54] BACKPLANE ASSEMBLY INCLUDING COAXIAL CONNECTORS

[75] Inventor: James Lamar Beard, Lilburn, Ga.

[73] Assignee: Northern Telecom Limited, Montreal, Canada

[21] Appl. No.: 455,640

[22] Filed: May 31, 1995

[51] Int. Cl.[6] .................................................. H01R 13/64
[52] U.S. Cl. .............................................. 439/247; 439/63
[58] Field of Search .................................. 439/248, 552, 439/126, 247, 63, 556, 559, 578, 95, 947; 361/424

[56] References Cited

U.S. PATENT DOCUMENTS

| | | | |
|---|---|---|---|
| 4,872,212 | 10/1989 | Roos et al. | 361/424 |
| 4,978,313 | 12/1990 | Kameyama et al. | 439/248 |

Primary Examiner—P. Austin Bradley
Assistant Examiner—Christopher Goins
Attorney, Agent, or Firm—Foley & Lardner

[57] ABSTRACT

A backplane assembly of electronic equipment includes a plurality of coaxial connectors which are engaged by complementary coaxial connectors on a removable circuit card as it is inserted into the equipment. Precise alignment of the coaxial connectors is facilitated by mounting each coaxial connector on the backplane in a resilient bushing which permits limited movement of the connector. The coaxial connectors are arranged in pairs, the connectors of each pair also passing through shaped holes in a grounding and retaining component having spring fingers around its periphery biassed against a ground conductor on the backplane. This component provides for electrical grounding of and shielding around the coaxial connectors, and prevents rotation of each coaxial connector about its own axis.

10 Claims, 2 Drawing Sheets

5,641,294

BACKPLANE ASSEMBLY INCLUDING COAXIAL CONNECTORS

This invention relates to backplane assemblies, and is particularly concerned with a backplane assembly which comprises a backplane and a plurality of connectors at least one of which comprises a coaxial connector. The invention also relates to electronic equipment including such a backplane assembly and at least one circuit card removably connected thereto.

BACKGROUND OF THE INVENTION

It is well known to provide electronic communications equipment in which circuit cards are removably connected to a backplane, the circuit cards being arranged parallel to one another and being guided in shelves to be perpendicular to the backplane, with electrical connections being established between connectors on the backplane and complementary connectors on the back edge of each circuit card. Typically, the connectors are constituted by multiple pins and sockets arranged in one or more lines (inline connectors) along part or all of the back edge of the circuit card. When a circuit card is inserted into the equipment, the shelf guides provide an approximate alignment for the pins and sockets, and a precise alignment is achieved by surrounds around the pins and sockets.

There is an increasing need in the communications industry to communicate signals, for example at radio frequencies above about 5 MHz, via coaxial cables. As is well known, a coaxial cable consists of a central conductor and a surrounding shield which is grounded to prevent radiation of a signal from the central conductor. Coaxial connectors, providing for connections between a coaxial cable and another coaxial cable or conductors on a circuit card while maintaining continuity of the shield and a desired characteristic impedance of the cables to avoid signal reflections, are also well known.

It is desirable to provide coaxial connections between circuit cards and a backplane in a similar manner to the in-line connectors referred to above, using conventional coaxial connectors. However, this presents a serious problem in that conventional coaxial connectors allow for very little mechanical misalignment. Providing the necessary mechanical alignment for one or more coaxial connectors, on a circuit card which also provides other, coaxial and/or in-line, connectors, with complementary connectors on the backplane requires close tolerances which can not reasonably be met in manufacture. This problem increases with increasing sizes of circuit card and increasing distances between the connectors.

An object of this invention, therefore, is to provide a backplane assembly, including a plurality of connectors at least one of which is a conventional coaxial connector, which avoids or eliminates this problem.

SUMMARY OF THE INVENTION

According to one aspect, this invention provides a backplane assembly comprising a backplane and a plurality of connectors on the backplane, for providing connections with complementary connectors on a removable circuit card perpendicular to the backplane, wherein at least one of the plurality of connectors comprises a coaxial connector extending through a resilient bushing in an aperture in the backplane, the resilient bushing providing limited movement of the coaxial connector relative to the backplane.

In a backplane assembly in accordance with the invention, the limited movement provided for the coaxial connector by the resilient bushing enables a precise alignment to be achieved with the complementary coaxial connector on the circuit card as it is inserted in electronic equipment including the backplane assembly, whereby the need for very precise positioning tolerances is avoided. This limited movement can include both lateral movement of the coaxial connector in or parallel to the plane of the backplane, and angular movement of the coaxial connector about axes in or parallel to the plane of the backplane.

Because the resilient bushing generally is likely to be an electrical insulator, and it is desirable to continue the shielding provided by a coaxial cable and the coaxial connector to grounded conductors on the backplane, preferably the backplane assembly includes a grounding component having a hole through which the coaxial connector extends, the grounding component providing an electrical connection between a sleeve of the coaxial connector and a conductor on the backplane around the periphery of the coaxial connector. The grounding component preferably includes peripheral conductive fingers which are biassed against the conductor on the backplane to provide electrical connection therewith.

It is desirable to prevent rotation of the coaxial connector about its own axis. To this end, preferably the coaxial connector and the hole in the grounding component have complementary flats which inhibit rotation of the coaxial connector relative to the grounding component. The grounding component thereby serves a dual function of grounding and inhibiting rotation of the coaxial connector.

In a preferred embodiment of the invention, the plurality of connectors on the backplane comprise two spaced coaxial connectors each extending through a respective resilient bushing.

In this case the assembly preferably includes a grounding component having two spaced holes through which the two coaxial connectors extend, the grounding component providing electrical connections between a sleeve of each coaxial connector and a conductor on the backplane around the two coaxial connectors, the grounding component preferably including peripheral conductive fingers which are biassed against the conductor on the backplane to provide electrical connection therewith. Preferably the two coaxial connectors and the two holes in the grounding component have complementary flats which inhibit rotation of each coaxial connector relative to the grounding component.

Alternatively, the assembly can include a retaining component having two spaced holes through which the two coaxial connectors extend, the two coaxial connectors and the two holes in the retaining component having complementary shapes which inhibit rotation of each coaxial connector relative to the retaining component.

Thus the assembly can include a grounding component and/or a retaining component which inhibits rotation, and preferably the same component performs both of the grounding and retaining functions.

The invention also extends to electronic equipment comprising a backplane assembly as recited above, guides for guiding a circuit card perpendicular to the backplane, and at least one circuit card guided by the guides and having connectors complementary to connectors on the backplane removably inserted in the equipment with the complementary connectors on the circuit card connected to the connectors on the backplane.

Another aspect of the invention provides a method of providing coaxial connections between coaxial connectors on a backplane of electronic equipment and complementary coaxial connectors at a back edge of a circuit card removably inserted into the electronic equipment, comprising the steps of mounting each coaxial connector on the backplane in a resilient bushing to provide for limited movement of the coaxial connector relative to the backplane, and guiding the circuit card into a position to engage the complementary coaxial connectors on the circuit card with the coaxial connectors on the backplane, the limited movement of the coaxial connectors on the backplane enabling a precise alignment of the coaxial connectors on the backplane with the complementary coaxial connectors on the circuit card.

Preferably the method further comprises the step of engaging complementary pin and socket connectors on the backplane and the circuit card simultaneously with the engagement of the complementary coaxial connectors on the circuit card with the coaxial connectors on the backplane.

BRIEF DESCRIPTION OF THE DRAWINGS

The invention will be further understood from the following description by way of example with reference to the accompanying drawings, in which.

DETAILED DESCRIPTION

Figure 1:
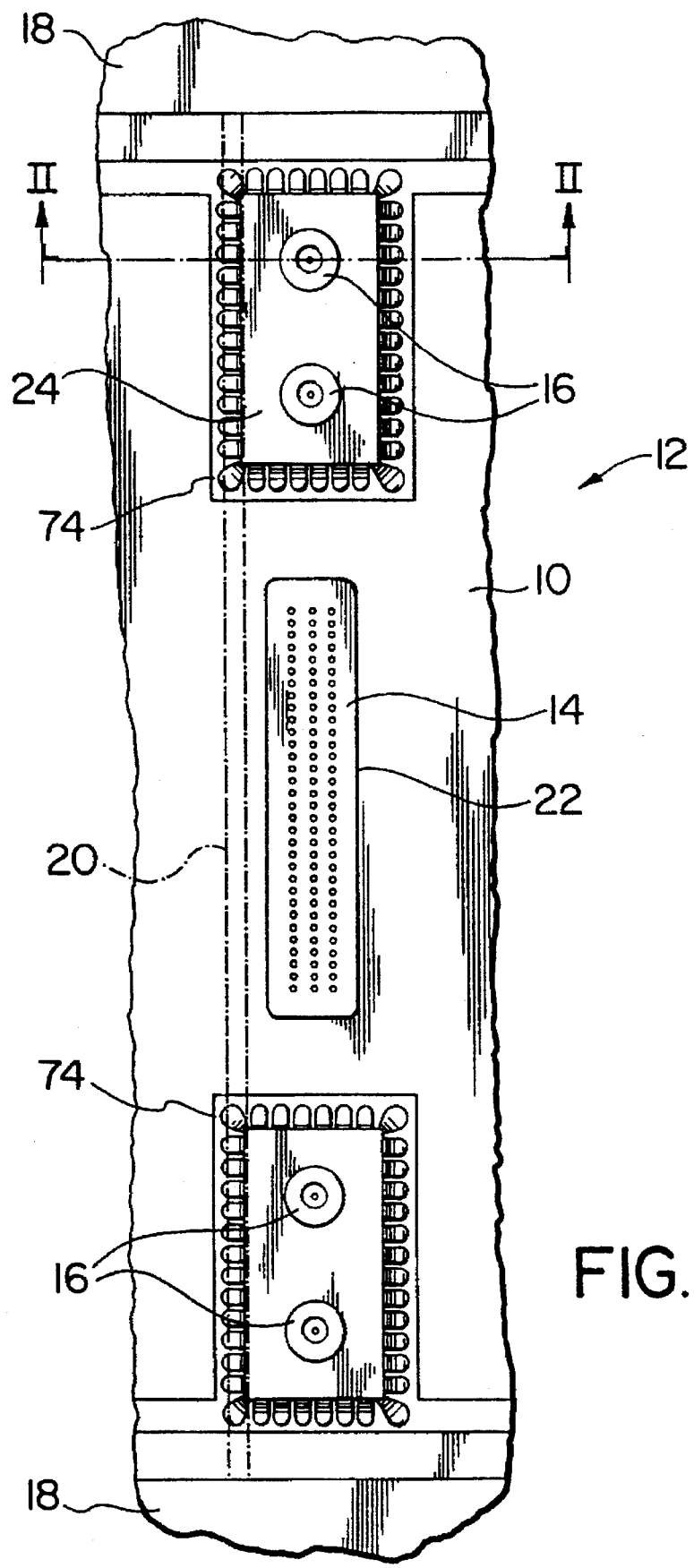
FIG. 1 is a partial illustration of a backplane assembly in accordance with an embodiment of the invention.

Referring to FIG. 1, there is illustrated a front view of part of a backplane 10 forming part of an item of electronic communications equipment 12 comprising shelves of circuit cards each of which is removably electrically connected to the backplane 10 via connectors 14 and 16 on the backplane as described further below. The circuit cards are arranged vertically, side by side and parallel to one another, perpendicularly to the backplane 10, and each circuit card is guided between upper and lower shelf guides 18 in known manner in a position 20 shown by dashed lines. Electrical connectors (not shown in FIG. 1) at the back edge of a circuit card (i.e. at the leading edge of the circuit card as it is inserted into the equipment) which are complementary to the connectors 14 and 16 couple to the connectors 14 and 16 to provide desired electrical connections between the circuit card and the backplane 10. The connectors 14 and 16 and the backplane 10 together form a backplane assembly.

The connector 14 is, for example, a 3-row 96-socket DIN connector of known form, comprising 96 sockets arranged in three rows each of 32 sockets, for engagement with pins arranged in a complementary manner on the circuit card. A surround 22 serves for accurate mechanical alignment of the pins and sockets. As such a connector is well known in the art, it is not further described here. Each of the connectors 16, four of which are shown in FIG. 1, is a coaxial connector of known form, mounted in a manner as described in detail below to facilitate precise mechanical alignment, and consequent engagement, with complementary coaxial connectors on the circuit card as this is inserted into the equipment. As will become clear from the following description, the coaxial connectors 'float' mechanically but are electrically connected to conductors on the backplane 10 by conductive spring fingers.

As shown in FIG. 1, the coaxial connectors 16 are arranged in two pairs of connectors each with a generally rectangular retaining and grounding component 24 which is described further below. For example, each pair of coaxial connectors 16 can provide for signal connections for opposite (transmit and receive) directions of transmission to and from a respective communications terminal (not shown) for the signals. It is thus convenient to provide the coaxial connectors 16 in pairs, but the invention is not limited to this and extends to a backplane assembly including only a single connector 16 and another connector such as 14 or 16.

Figure 2:
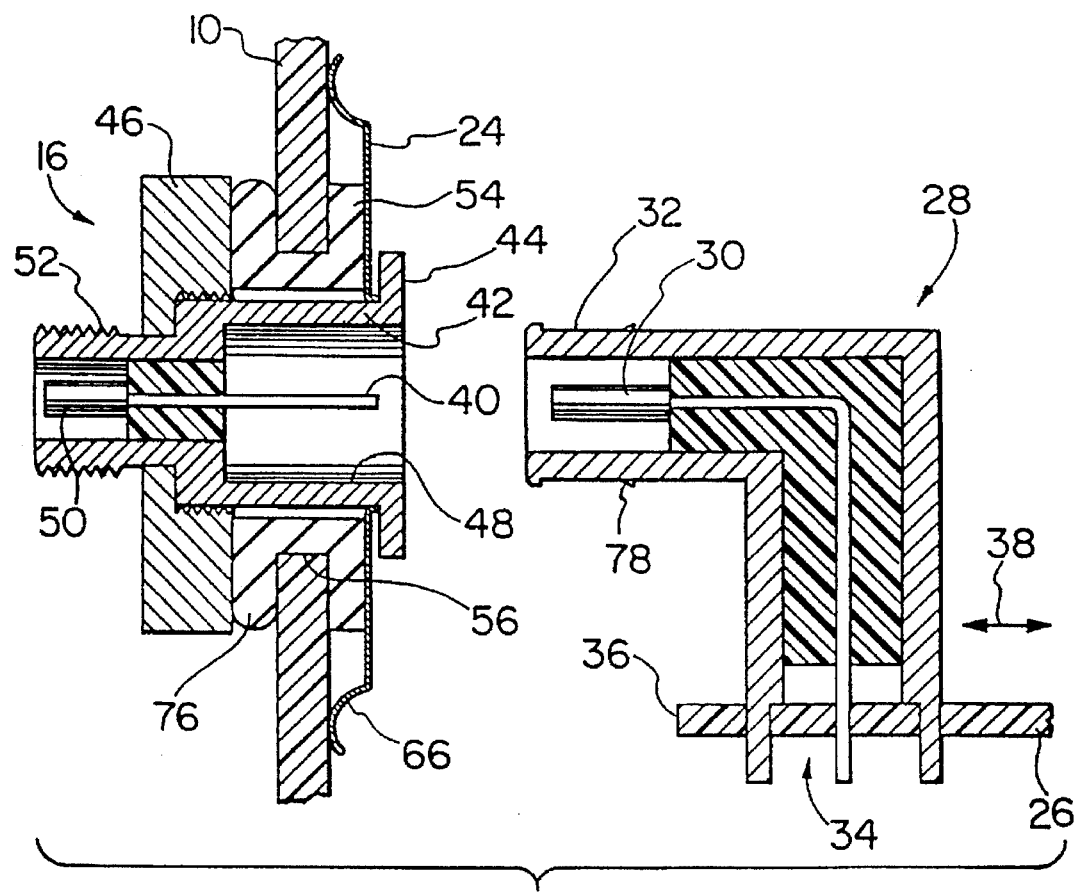
FIG. 2 is a cross-sectional illustration of the backplane assembly of FIG. 1, the section being taken on the lines II—II of FIG. 1.

Reference is now made to FIG. 2, which shows a cross-sectional illustration of the backplane assembly taken on the lines II—II of FIG. 1, together with a corresponding cross-sectional view of part of a circuit card 26 including a complementary coaxial connector 28 for coupling to a coaxial connector 16 on the backplane 10. The coaxial connector 28 is a conventional female coaxial connector including a central conductor socket 30 and a surrounding sleeve 32, with a printed circuit mounting and connections 34 to the circuit card 26 adjacent to the back or leading edge 36 of the circuit card. A double-headed arrow 38 indicates the direction of insertion and removal of the circuit card 26 within the shelf guides 18.

The coaxial connector 16 is a conventional male coaxial connector including a central conductor pin 40 and a surrounding sleeve 42 terminating in a front flange 44. An outer part of the sleeve 42 is threaded to receive a stopped nut 46, and has flats 48 on each side to inhibit rotation of the connector as described below. A rearwardly extending part of the connector 16 includes a central socket 50 and a threaded sleeve 52 for receiving a conventional coaxial cable connection (not shown).

The sleeve 42 passes through a shaped hole in the retaining and grounding component 24, against which the flange 44 abuts, and then through a central hole in a resilient bushing 54, which is received within a larger hole 56 in the backplane 10. The resilient bushing 54 is shown in greater detail and in an undeformed state in FIG. 3, and the retaining and grounding component 24 is shown in greater detail in FIG. 4.

Figure 3:
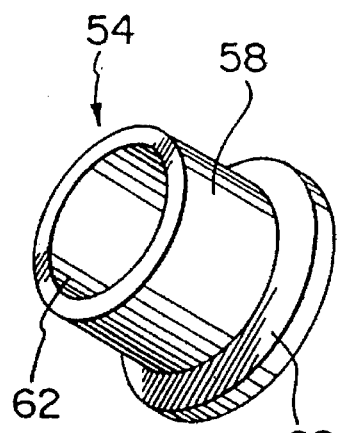
FIG. 3 is an isometric illustration of a resilient bushing of the backplane assembly.

Referring to FIG. 3, the resilient bushing 54 comprises a cylindrical portion 58 and a front flange 60 which are integrally formed for example from a closed cell expanded silicon rubber material, which has the characteristics of being resilient, electrically insulating, and flame retardant. FIG. 3 also shows the central hole 62 of the bushing 54, through which the sleeve 42 of the connector 16 passes as shown in FIG. 2.

Figure 4:
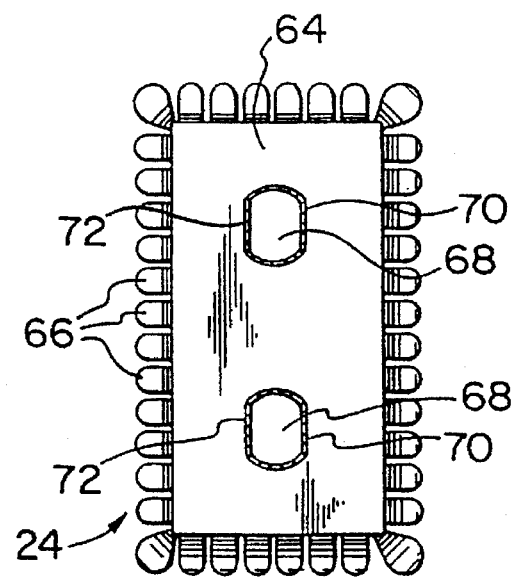
FIG. 4 illustrates a retaining and grounding component of the backplane assembly.

Referring to FIG. 4, the retaining and grounding component 24 comprises a generally rectangular thin member 64 of a beryllium-copper or phosphor-bronze alloy, having spring fingers 66 extending outwardly and downwardly around its entire periphery. The member 64 includes two holes 68, spaced apart and sized for receiving the sleeves 42 of one pair of connectors 16, each hole 68 being shaped with flats 70 corresponding to the flats 48 on the sleeves 42. Smaller spring fingers 72 extend inwardly and upwardly around the periphery of each of the holes 68.

With the sleeve 42 of a connector 16 inserted through one of the holes 68 in the component 24 and through the central hole 62 of the resilient bushing 54, with the bushing received within the hole 56 in the backplane 10, as shown in FIG. 2, the component 24 is held between the flange 44 of the connector 16 and the front flange 60 of the resilient bushing 54. The fingers 72 then provide electrical connection to the sleeve 42 of the connector 16, and the fingers 66 are biassed against and provide electrical connection to grounded conductors 74 (shown in FIG. 1) on the front face of the backplane 10, thereby providing a substantially continuous grounded shield around the connector 16.

Threading the stopped nut 46 onto the rearward part of the sleeve 42 deforms outwardly the rearward part of the cylindrical portion 58 of the resilient bushing 54, as shown at 76 in FIG. 2, whereby this deformation 76 and the front flange 60 of the bushing 54 are biassed respectively against the back and front faces of the backplane 10 to hold the connector 16 firmly, but resiliently, mounted in the hole 56 in the backplane. The flats 48 on the sleeve 42, the flats 70 of the component 24, and the provision of the two connectors 16 for a single component 24 prevent rotation of each connector 16 about its axis on rotation of either the stopped nut 46 or a coaxial cable connection on the threaded sleeve 52. The stopped form of the nut 46 prevents excessive deformation of the resilient bushing 54 in the region 76.

On insertion of a circuit card 26 into the electronic equipment, the shelf guides 18 provide an approximate alignment, and the surround 22 provides a precise alignment, for the sockets and pins of the connector 14 and the complementary connector on the circuit card. At the same time, the resilient mounting of each of the connectors 16, as a result of its resilient bushing 54, provides a limited degree of movement of each connector 16 in directions parallel to (or in the plane of) the backplane, as well as a slight angular freedom of movement of each connector 16, which enables each connector 16 to align itself precisely with the complementary connectors 28 on the circuit card 26, so that all of the complementary connectors can easily engage with one another without requiring very precise tolerances. Circumferential spring fingers 78 on the front of each connector 28 provide positive electrical connection to the inside of the sleeve 42 of the respective connector 16.

Although a particular embodiment of the invention has been described in detail, it should be appreciated that numerous variations, modifications, and adaptations can be made thereto within the scope of the appended claims. For example, the component 24 could be provided behind, instead of in front of, the resilient bushing 54 to make contact with conductors on the back surface of the backplane 10, and/or the resilient bushing 54 can be reversed so that the flange 60 is behind the backplane 10 rather than in front of it as shown in FIG. 2. In addition, the component 24 need not necessarily provide any electrical connection to the sleeve 42 of the coaxial connector 16 or to conductors on the backplane, instead merely serving for mechanically inhibiting rotation of the coaxial connector. Furthermore, the component 24 can be provided for individually for each connector 16 or commonly for more than two connectors 16, or it can be omitted entirely. Especially in the latter case, the resilient bushing 54 and/or the hole 56 in the backplane 10 can be shaped with tars to inhibit rotation of the coaxial connector 16. However, the provision of the component 24 and the electrical connection which it provides are highly desirable for shielding, which can be seriously impaired by the absence of this electrical connection. The resilient bushing 54 need not have the configuration shown; it could instead, for example, be in the form of a grommet, with both front and rear flanges, which is received in the backplane hole 56 and which need not be appreciably deformed by the nut 46 threaded onto the sleeve 42.

What is claimed is:

1. A backplane assembly comprising a backplane and a plurality of connectors on the backplane, for providing connections with complementary connectors on a removable circuit card perpendicular to the backplane, wherein at least one of the plurality of connectors comprises a coaxial connector extending through a resilient bushing in an aperture in the backplane, the resilient bushing providing limited movement of the coaxial connector relative to the backplane, the backplane assembly further including a grounding component having a hole through which the coaxial connector extends, the grounding component providing an electrical connection between a sleeve of the coaxial connector and a conductor on the backplane around the periphery of the coaxial connector.

2. A backplane assembly as claimed in claim 1 wherein the grounding component includes peripheral conductive fingers which are biassed against the conductor on the backplane to provide electrical connection therewith.

3. A backplane assembly as claimed in claim 1 wherein the coaxial connector and the hole in the grounding component have complementary flats which inhibit rotation of the coaxial connector relative to the grounding component.

4. A backplane assembly as claimed in claim 1 wherein at least another of the plurality of connectors comprises an in-line pin connector.

5. Electronic equipment comprising a backplane assembly as claimed in claim 1, guides for guiding a circuit card perpendicular to the backplane, and at least one removable circuit card guided by the guides and having connectors complementary to connectors on the backplane connected to the connectors on the backplane.

6. A backplane assembly comprising a backplane and a plurality of connectors on the backplane, for providing connections with complementary connectors on a removable circuit card perpendicular to the backplane, wherein the plurality of connectors comprise two spaced coaxial connectors each extending through a respective resilient bushing in a respective aperture in the backplane, each resilient bushing providing limited movement of the respective coaxial connector relative to the backplane, the backplane assembly further including a grounding component having two spaced holes through which the two coaxial connectors extend, the grounding component providing electrical connections between a sleeve of each coaxial connector and a conductor on the backplane around the two coaxial connectors.

7. A backplane assembly as claimed in claim 6 wherein the grounding component includes peripheral conductive fingers which are biassed against the conductor on the backplane to provide electrical connection therewith.

8. A backplane assembly as claimed in claim 7 wherein the two coaxial connectors and the two holes in the grounding component have complementary flats which inhibit rotation of each coaxial connector relative to the grounding component.

9. A backplane assembly as claimed in claim 6 wherein the two coaxial connectors and the two holes in the grounding component have complementary flats which inhibit rotation of each coaxial connector relative to the grounding component.

10. A backplane assembly comprising a backplane and a plurality of connectors on the backplane, for providing connections with complementary connectors on a removable circuit card perpendicular to the backplane, wherein the plurality of connectors comprise two spaced coaxial connectors each extending through a respective resilient bushing in a respective aperture in the backplane, each resilient bushing providing limited movement of the respective coaxial connector relative to the backplane, the backplane assembly further including a retaining component having two spaced holes through which the two coaxial connectors extend, wherein the two coaxial connectors and the two holes in the retaining component have complementary shapes which inhibit rotation of each coaxial connector relative to the retaining component.

* * * * *